United States Patent [19]

Nakazato et al.

[11] Patent Number: 5,718,628
[45] Date of Patent: Feb. 17, 1998

[54] AIR CONDITIONING METHOD IN MACHINE ROOM HAVING FORCED AIR-COOLING EQUIPMENT HOUSED THEREIN

[75] Inventors: Hideaki Nakazato; Hirofumi Hayama, both of Tokyo; Manabu Kishita, Iruma; Masaki Nakao, Hoya, all of Japan

[73] Assignees: NTT Power and Building Facilities, Inc.; Nippon Telegraph and Telephone Corporation, both of Tokyo, Japan

[21] Appl. No.: 641,079

[22] Filed: Apr. 26, 1996

[30] Foreign Application Priority Data

May 2, 1995 [JP] Japan .................. 7-108716

[51] Int. Cl.$^6$ .................................................. H05K 7/20
[52] U.S. Cl. ................ 454/184; 236/49.5; 361/678; 454/186
[58] Field of Search ................... 454/184, 185, 454/186; 361/678, 691, 696; 236/49.5

[56] References Cited

U.S. PATENT DOCUMENTS

| | | | |
|---|---|---|---|
| 3,903,404 | 9/1975 | Beall et al. | 361/695 X |
| 4,337,499 | 6/1982 | Cronin et al. | |
| 4,774,631 | 9/1988 | Okuyama et al. | 361/678 X |
| 4,874,127 | 10/1989 | Collier | 454/186 X |
| 5,000,079 | 3/1991 | Mardis | 361/695 X |

FOREIGN PATENT DOCUMENTS

| | | | |
|---|---|---|---|
| 1063242 | 8/1959 | Germany. | |
| 9319483 | 2/1994 | Germany. | |
| 4-320397 | 11/1992 | Japan | 361/691 |
| 5-259674 | 10/1993 | Japan | 361/695 |
| 6-25622 | 4/1994 | Japan. | |
| 472793 | 6/1969 | Switzerland. | |

OTHER PUBLICATIONS

Wilhelm Horn, "Air-Conditioning Cabinets for Computer Centres", Siemens Review, XLIV, No. 12, Dec. 1977, pp. 542-544.
Nokazato, M., et al., "Studies of Air-Conditioning System for Computer Rooms", pp. 257-268, Transactions of Air-Conditioning and Plumbing Contractor's Association of Japan, announced Oct. 2, 1995.

*Primary Examiner*—Harold Joyce
*Attorney, Agent, or Firm*—John P. White

[57] ABSTRACT

The cooling air generated from an air conditioner is supplied into an air passageway formed below the floor on which an equipment is disposed. The cooling air supplied to the air passageway is guided into the equipment through an opening made in the floor. The cooling air introduced into the equipment is released into the free space within the room. Further, the air stream released into the free space of the room is partly introduced again into the equipment.

3 Claims, 6 Drawing Sheets

AIR CONDITIONING METHOD IN MACHINE ROOM HAVING FORCED AIR-COOLING EQUIPMENT HOUSED THEREIN

BACKGROUND OF THE INVENTION

1. Field of the Invention

The present invention relates to an air conditioning method in which a cooling air is supplied through an air passageway formed below a floor into a forced air-cooling equipment disposed on the floor.

2. Description of the Related Art

A double floor structure is widely employed in installing an electronic computer, a communication equipment, etc. within a room. The double floor structure comprises a base floor and a room floor formed above and a predetermined distance apart from the base floor such that a free space is defined between the base floor and the room floor. Since the electric cable of the electronic computer, etc. is housed in the particular free space, the room space can be utilized effectively.

It should be noted that a considerable amount of heat is generated during operation of the electronic computer or another equipment, making it necessary to install an air conditioning apparatus so as to cool the electronic computer or the like. For example, it is known to the art that a cooling air generated from an air conditioner is supplied through the free space of the double floor structure into the electronic computer or the like. Incidentally, where an equipment itself is constructed to take a cooling air thereinto, the equipment is called a forced air-cooling equipment. Where an air conditioner is used for cooling all the forced air-cooling equipments within the machine room, the air blowing capacity and the power for driving the fan required for achieving a desired cooling capacity of the air conditioner tend to be increased. As a result, the facility cost and the operating cost are increased.

It should also be noted that the amount of the heat generation differs depending on the equipment, with the result that air streams of different temperatures are released from different equipments. What should be noted in the case of installing a plurality of equipments within a single room is that the temperature within the room is not distributed as desired, making it difficult to maintain a comfortable environment within the room. Particularly, an air stream of low temperature is released from an equipment whose heat generation is small. In this case, the ambient temperature is lowered to cause the person within the room to feel chilly.

SUMMARY OF THE INVENTION

An object of the present invention is to provide an air conditioning method which permits cooling an equipment within a room without fail, while reducing the facility cost and operating cost, and also permits improving the temperature distribution within the machine room by suppressing release of an air stream having a low temperature so as to provide a comfortable environment within the room.

According to the present invention, there is provided an air conditioning method, comprising the steps of:

supplying a cooling air generated from an air conditioner into an air passageway formed below a floor;

guiding said cooling air within said air passageway into an equipment disposed on the floor through an opening made in the floor;

releasing the cooling air introduced into said equipment into the free space within a room; and introducing the air within the room into the equipment.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

DETAILED DESCRIPTION OF THE PREFERRED EMBODIMENTS

Figure 1:
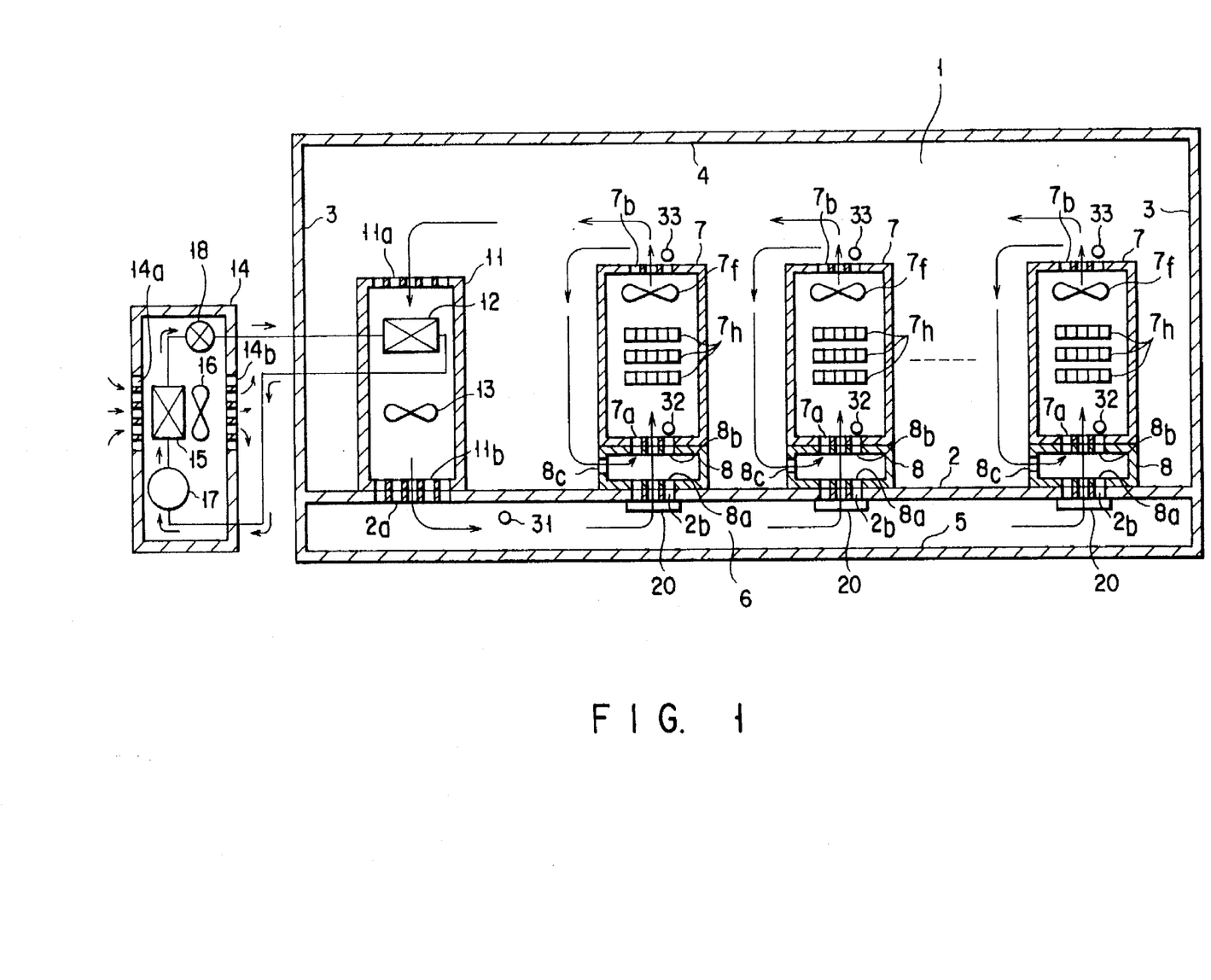
FIG. 1 schematically shows the construction of an air conditioning system used in a method according to a first embodiment of the present invention.

FIG. 1 shows an air conditioning system used in a method according to a first embodiment of the present invention. As shown in the drawing, a room space 1 is defined by a room floor 2, side walls 3 and a ceiling plate 4. The room floor 2 is formed a predetermined distance above a base floor 5 such that the room floor 2 and the base floor 5 collectively form a double floor structure having a free space 6 (air passageway) formed therein. A plurality of equipments 7 are disposed on the floor 2. Each of these equipments 7 is a so-called forced air-cooling equipment which is constructed to take a cooling air thereinto for the cooling purpose. Electric cables for these equipments 7 are housed in the free space 6 of the double floor structure.

In installing each of these equipments 7 on the floor 2, a plurality of support members 8, which are stationary, are fixed by bolts to predetermined positions of the floor 2. Then, the equipments 7 are disposed on the support members 8. It is also possible to use movable support members 8 equipped with wheels.

Each equipment 7 comprises a casing having air inlets 7a and air outlets 7b formed through the bottom plate and the ceiling plate of the casing, respectively. A fan 7f is arranged below the air outlets 7b inside the casing. The fan 7f is operated during operation of the equipment 7 so as to form an air passageway within the casing including the air inlets 7a and the air outlets 7b. As seen from the drawing, a heat-generating member 7h is arranged in the air passageway formed within the casing.

An indoor unit 11 included in an air conditioner is also installed on the floor 2. The indoor unit 11 comprises a casing having air inlets 11a and air outlets 11b formed through the ceiling plate and the bottom plate of the casing, respectively. An indoor heat exchanger 12 and an indoor fan 13 are arranged between the air inlets 11a and the air outlets 11b within the casing. The indoor fan 13 permits the air within the room space 1 to be sucked into the casing through the air inlets 11a and also permits the air sucked into the casing to flow through the indoor air exchanger 12 so as to be discharged outside the casing through the air outlets 11b.

An outdoor unit 14 is mounted outside the side wall 3. The outdoor unit 14 and the indoor unit 11 collectively form an air conditioner. The outdoor unit 14 comprises a casing having air inlets 14a and air outlets 14b formed through the wall thereof. An outdoor heat exchanger 15 and an outdoor fan 16 are arranged between the air inlets 14a and the air outlets 14b within the casing. Further, a compressor 17 and an expansion valve 18 are housed in the casing of the outdoor unit 14.

The outdoor fan 16 permits the outdoor air to be sucked through the air inlets 14a into the casing and also permits the sucked air to flow through the outdoor heat exchanger 15 and, then, to flow outside the casing through the air outlets 14b.

One end of the outdoor heat exchanger 15 is connected via a pipe to the discharge port of the compressor 17. Also, one end of the indoor heat exchanger 12 is connected via the expansion valve 18 to the other end of the outdoor heat exchanger 15. Further, the suction port of the compressor 17 is connected via a pipe to the other end of the indoor heat exchanger 12. A refrigerating cycle is formed by the above-noted connection of the members of the air conditioner.

When the compressor 17 begins to be operated, the refrigerant discharged from the compressor 17 forms a cooling cycle extending through the outdoor heat exchanger 15, the expansion valve 18, the indoor heat exchanger 12 and, then, back to the compressor 17. During the cooling cycle, the outdoor heat exchanger 15 acts as a condenser, with the indoor heat exchanger 12 acting as an evaporator.

When the indoor fan 13 begins to be operated, the air within the room space 1 is sucked into the casing of the indoor unit 11 through the air inlets 11a. The air sucked into the casing is cooled by the indoor heat exchanger 12 and, then, the cooled air is discharged outside the casing through the air outlets 11b.

An opening 2a communicating with the air outlets 11b are formed through the floor 2 positioned below the indoor unit 11. Likewise, openings 2b are formed through the floor 2 positioned below each of the equipment 7. An air volume rate control unit 20 is mounted to each of the openings 2b so as to control the volume of the air flowing through the openings 2b.

The cooling air blown through the air outlets 11b of the indoor unit 11 is supplied into the free space 6 of the double floor structure through the opening 2a formed through the floor 2 and, then, into the support members 8 through the openings 2b formed through the floor 2. As apparent from the drawing, the support member 8 comprises a casing having openings 8a, 8b and 8c formed in the bottom plate, the ceiling plate, and side plate, respectively. The openings 8a and 8b communicate with the opening 2b formed in the floor 2 and the air inlet 7a formed in the casing of the equipment 7, respectively.

A temperature sensor 31 is arranged within the free space 6 (air passageway) of the double floor structure in the vicinity of the opening 2a. Temperature Ta of the cooling air blown from the indoor unit 11 into the free space 6 is detected by the temperature sensor 31.

Likewise, a temperature sensor 32 is arranged within the casing of the equipment 7 in the vicinity of the air inlet 7a so as to detect the temperature Tb of the air flowing into the casing of the equipment 7 through the air inlet 7a. Further, a temperature sensor 33 is arranged in the vicinity of the air outlet 7b formed in each of the equipments 7. Of course, the temperature sensor 33 serves to detect the temperature Tc of the air flowing out of the air outlet 7b.

Figure 2:
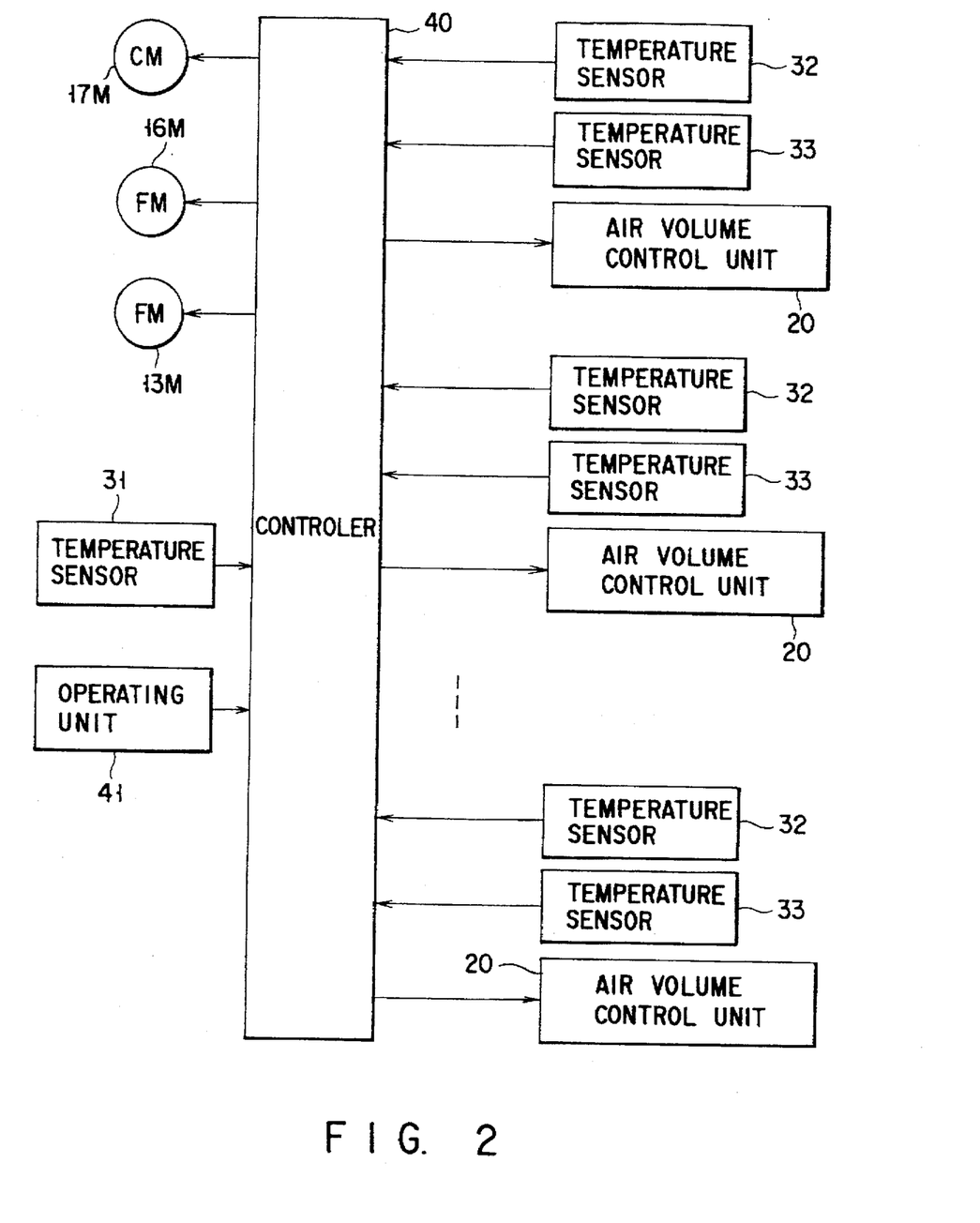
FIG. 2 is a block diagram showing the control circuit used in a method according to each embodiment of the present invention.

FIG. 2 is a block diagram showing the control circuit included in the system shown in FIG. 1. It is seen that connected to a controller 40 are a motor 17M of the compressor 17, a motor 16M of the outdoor fan 16, a motor 13M of the indoor fan 13, each of the air volume controlling units 20, the temperature sensor 31, each of the temperature sensors 32, each of the temperature sensors 33, and an operating unit 41. The controller 40 serves to control the operations of the motors 17M, 16M and 13M in accordance with instruction of the operating unit 41 to start and stop operating the system shown in FIG. 1. The controller 40 also gives instruction to the air volume control units 20 to control the air volume into the equipments 7 in accordance with the temperatures detected by the temperature sensors 31, 32 and 33.

In operating the equipment 7, the fan 7f arranged within the casing of the equipment 7 is operated. When the operating unit 41 is operated to start operating the system, the compressor 17 and the outdoor fan 16 included in the outdoor unit 14 begin to be operated. At the same time, the indoor fan 13 included in the indoor unit 11 also begins to be operated.

The air within the room space 1 is sucked into the indoor unit 11 through the air inlet 11a and cooled in the indoor unit 11. The cooled air is discharged as a cooling air through the air outlets 11b and the opening 2a made in the floor 2 and communicating with the air outlets 11b into the free space 6 of the double floor structure. The cooling air supplied to the free space 6 flows through the openings 2b, the supporting members 8 and the air inlets 7a into the casings of the equipments 7 as denoted by arrows in FIG. 1, as a result of operations of the fans 7f arranged within the casings of the equipments 7. The cooling air introduced into the casings of the equipments 7 absorbs the heat generated from the heat generating members 7h arranged within the casings and, then, is released into the room space 1. The air released into the room space 1 is sucked again into the indoor unit 11 as a result of operation of the indoor fan 13 and, then, the cooled air is released into the free space 6 (air passageway) of the double floor structure as described above.

It should be noted that the air blowing volume of the fan 7f included in each equipment 7 is larger than the air volume sucked into the equipment 7 through the floor 2 and the support member 8. Because of the extra blowing volume of the fan 7f, the air released into the room space 1 is partly sucked into the casing of the equipment 7 through the opening 8c of the support member 8.

As described above, the air released from within the equipment 7 into the room space 1 partly flows into the support member 8 through the opening 8c and, then, is combined with the cooling air flowing through the openings 2b, 8a and 8b so as to be introduced into the casing of the equipment 7 for cooling the heat generating member 7h. What should be noted is that the heat generating member 7h is cooled by two air streams, i.e., the air stream flowing through the opening 2b made in the floor 2 and the other air stream flowing through the opening 8c. Naturally, the presence of the air stream flowing through the opening 8c makes it possible to diminish the air-blowing capacity of the indoor unit 11. In other words, the indoor fan 13 included in the indoor unit 11 is diminished, leading to reduction of the facility cost. It is also possible to suppress the power consumption of the indoor fan 13, leading to a low operating cost.

What should also be noted is that, since the air released from within the equipment 7 is partly recycled into the casing of the equipment 7, the temperatures of the air streams released from the plural equipments 7 are made uniform, leading to a satisfactory temperature distribution within the room space 1.

Where the heat generation from the equipment 7 is small, it may possibly happen that an air stream of a low temperature is released into the room space 1. However, the air stream actually released into the room space 1 is warmed to some extent by the partial recycling of the released air stream into the casing of the equipment 7, with the result that release of an air stream of a low temperature into the room space need not be worried about. In other words, the present invention makes it possible to prevent the ambient air from being cooled to cause the person in the room to feel chilly. It follows that a comfortable living environment can be maintained within the room space 1.

As pointed out above, the temperature of the air stream released from the equipment 7 is higher than that in the conventional system. Naturally, the temperature of the air sucked into the indoor unit 11 is also higher than that in the past. It follows that the indoor heat exchanger 12 included in the indoor unit 11 is enabled to exhibit an improved efficiency in the heat exchange performed between the refrigerant and the air stream sucked into the indoor unit 11. The improved heat exchange efficiency permits saving the energy required for operating the indoor heat exchanger 12, leading to reduction in the power consumption and in the operating cost.

Figure 3:
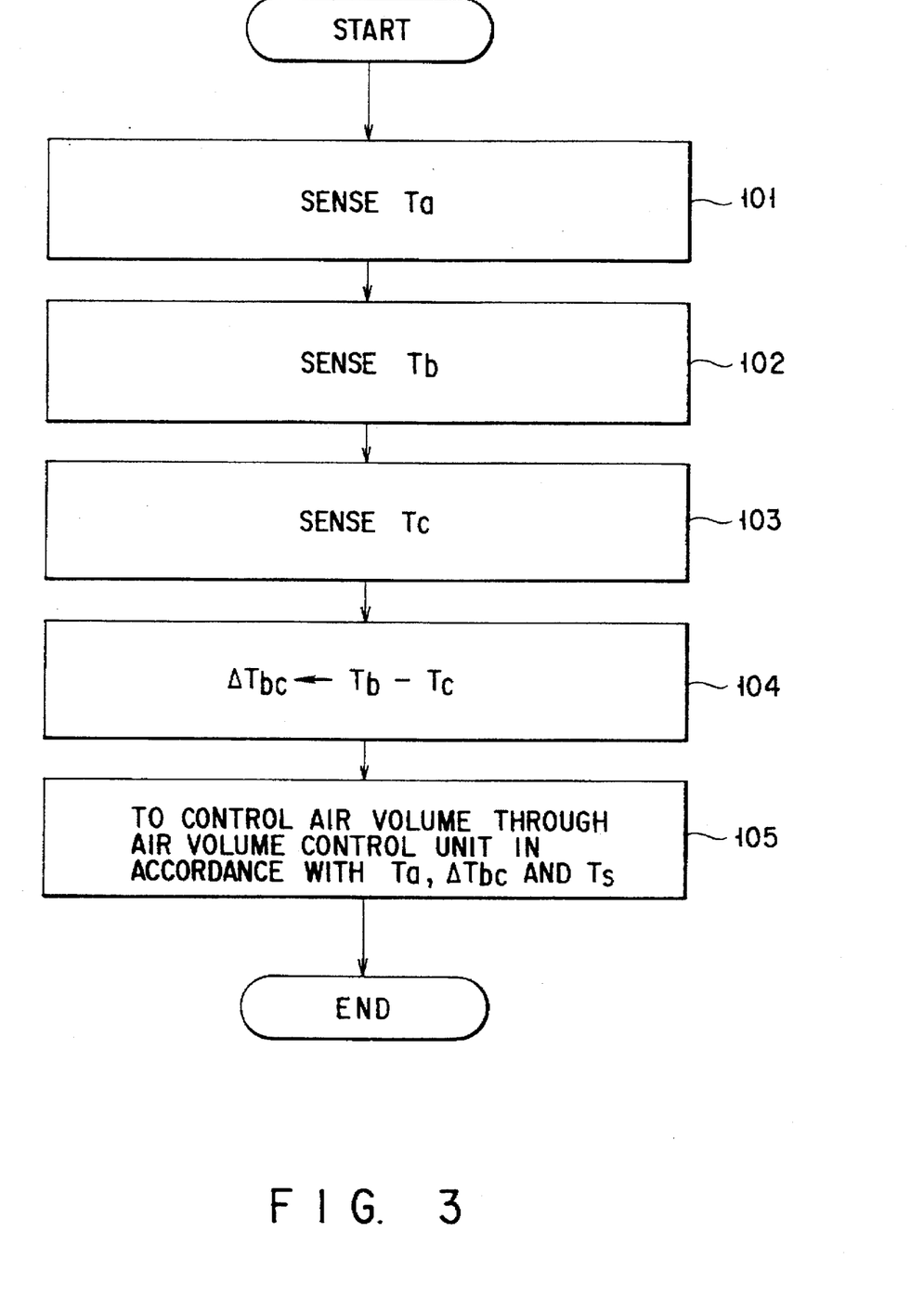
FIG. 3 is a flow chart showing how to control the air volume in a method according to each embodiment of the present invention.

FIG. 3 is a flow chart showing how to control the air flowing rate in the present invention. As shown in the flow chart, the temperature Ta of the cooling air blown from the indoor unit 11 is detected by the temperature sensor 31 in step 101. Then, the temperature Tb of the air streams introduced into the equipments 7 is detected by the temperature sensors 32 in step 102. Further, the temperature Tc of the air streams released from the equipments 7 is detected by the temperature sensors 33 in step 103, followed by calculating the difference ΔTbc between the temperature Tb detected by the temperature sensors 32 and the temperature Tc detected by the temperature sensors 33 in step 104.

Finally, the air volume flowing through the air volume control unit 20 is controlled in step 105 in accordance with the temperature Ta detected by the temperature sensor 31, the temperature difference ΔTbc calculated as above, and the temperature Ts within the room space 1 which is determined in advance by the operating unit 41. In this step, the temperature of the air stream released from each equipment 7 is controlled as desired so as to maintain an optimum temperature distribution within the room space 1 based on the room temperature Ts set in advance by the operating unit 41.

Figure 4:
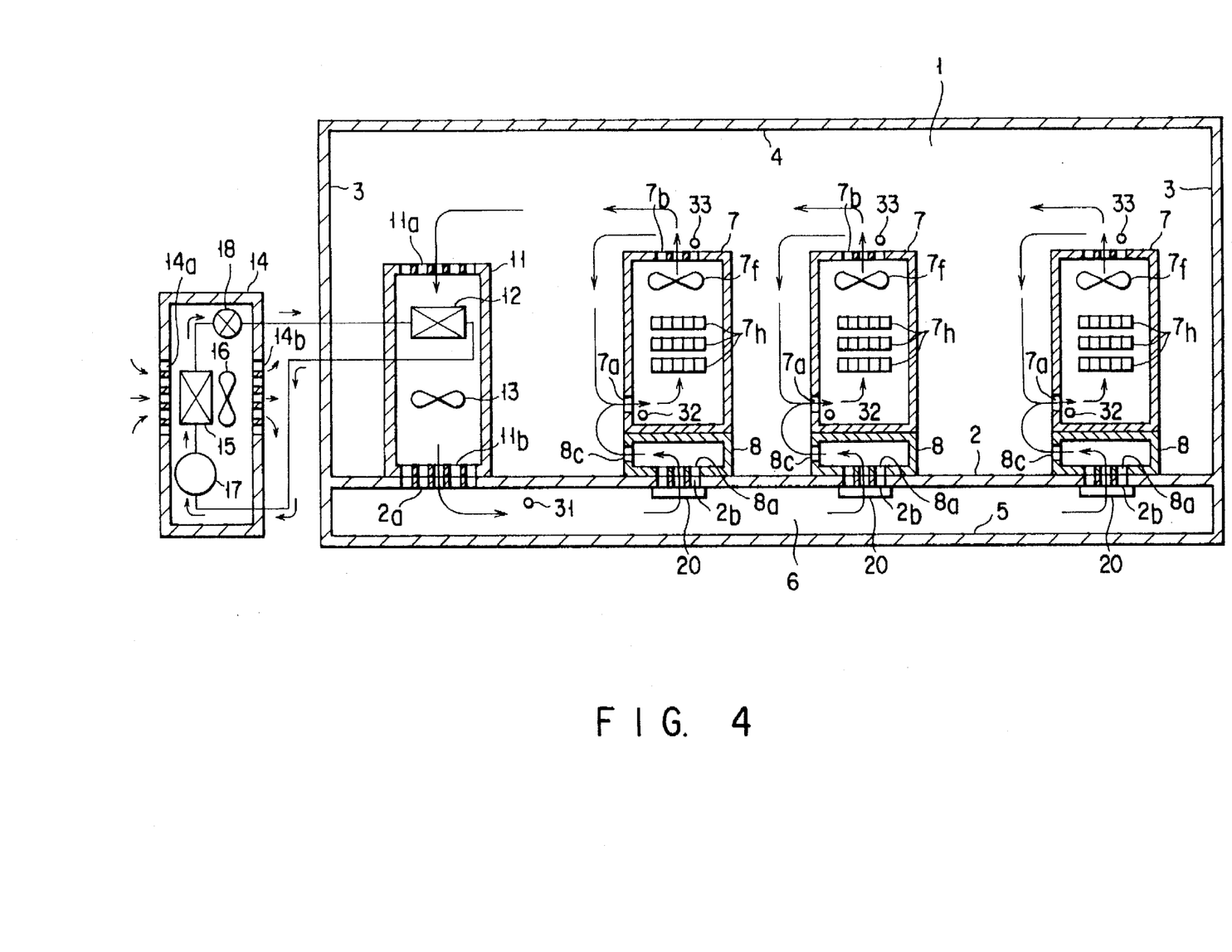
FIG. 4 schematically shows the construction of an air conditioning system used in a method according to a second embodiment of the present invention.

FIG. 4 shows an air conditioning system used in a method according to a second embodiment of the present invention. The system shown in FIG. 4 is substantially equal to that shown in FIG. 1, except that the opening 8b formed through the ceiling plate of the support member 8 in the embodiment shown in FIG. 1 is not formed in the embodiment of FIG. 4, and that the air inlet 7a is formed through the side wall of the casing of the equipment 7 in FIG. 4, not through the bottom plate of the casing of the equipment 7 as in FIG. 1.

In the embodiment of FIG. 4, the cooling air introduced into the free space 6 of the double floor structure flows through the air volume control unit 20 and the openings 2b and 8a into the support member 8. Further, the cooling air within the support member 8 flows through the opening 8c into the room space 1 and, then, is sucked through the air inlet 7a into the casing of the equipment 7. The cooling air introduced into the casing absorbs the heat generated from the heat generating member 7h arranged within the casing and, then, is released into the room space 1. The air stream released into the room space 1 partly joins the air stream flowing through the opening 8c of the support member 8 into the air inlet 7a of the equipment 7. In this fashion, the air stream released into the room space 1 is partly recycled into the casing of the equipment 7 so as to produce the prominent effects as already described in conjunction with the system shown in FIG. 1.

Figure 5:
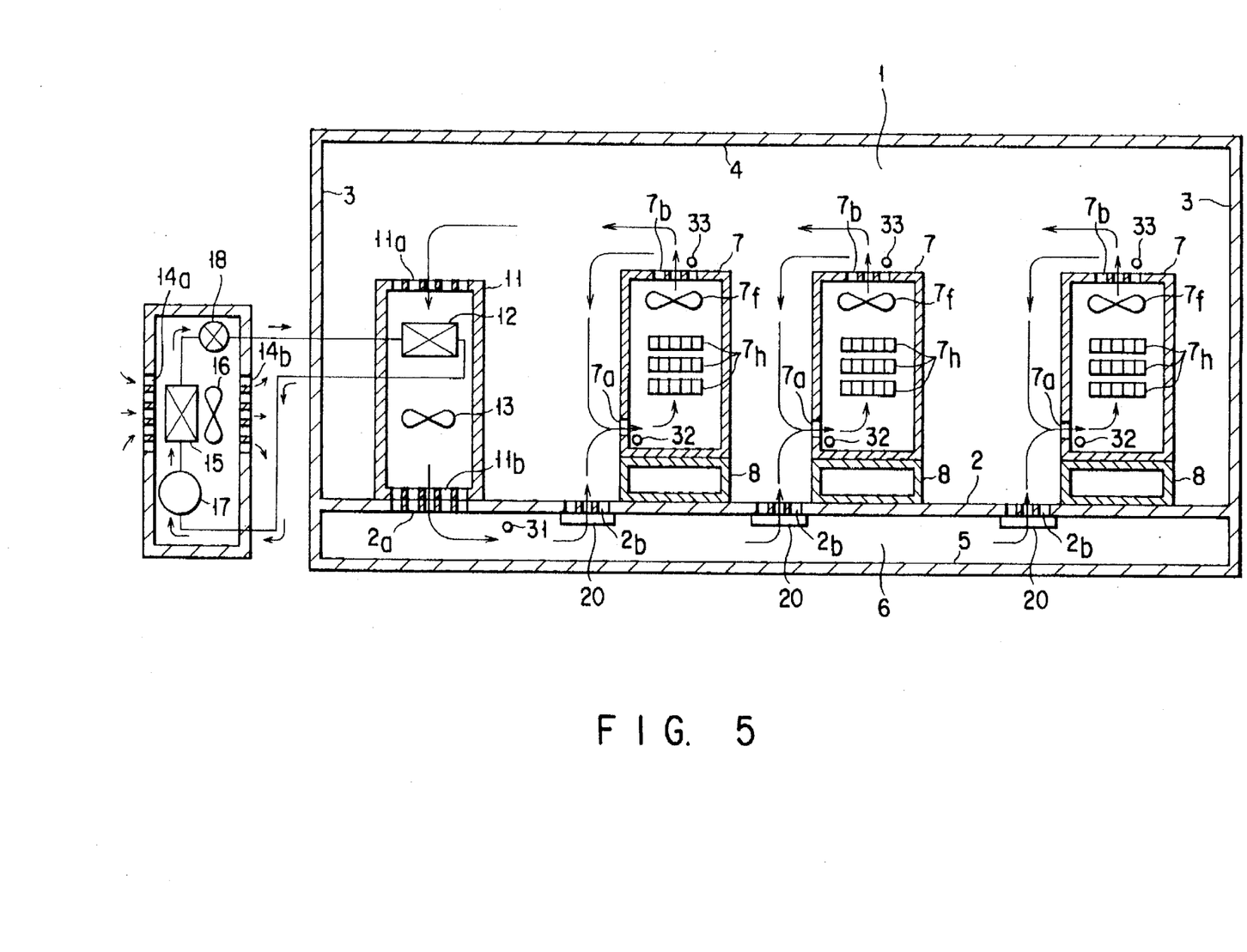
FIG. 5 schematically shows the construction of an air conditioning system used in a method according to a third embodiment of the present invention.

FIG. 5 shows an air conditioning system used in a method according to a third embodiment of the present invention. The system shown in FIG. 5 is substantially equal to that shown in FIG. 1, except that the support member 8 is not provided at all with an opening, and that the air inlet 7a is formed through the side wall of the casing of the equipment 7 in FIG. 5 as in FIG. 4, not through the bottom plate of the casing of the equipment 7 as in FIG. 1. Further, the opening 2b formed through the floor 2 right under the equipment 7 in FIG. 1 is moved immediately sideward of the support member 8. Of course, the air volume control unit 20 is also moved to be arranged for the moved opening 2b.

In the embodiment of FIG. 5, the cooling air introduced into the free space 6 of the double floor structure flows through the air flow volume control unit 20 and the opening 2b into the room space 1. Further, the cooling air within the room space 1 is sucked through the air inlet 7a into the casing of the equipment 7. The cooling air introduced into the casing absorbs the heat generated from the heat generating member 7h arranged within the casing and, then, is released into the room space 1. The air stream released into the room space 1 partly joins the air stream flowing through the opening 2b into the air inlet 7a of the equipment 7. In this fashion, the air stream released into the room space 1 is partly recycled into the casing of the equipment 7 so as to produce the prominent effects as already described in conjunction with the system shown in FIG. 1.

Figure 6:
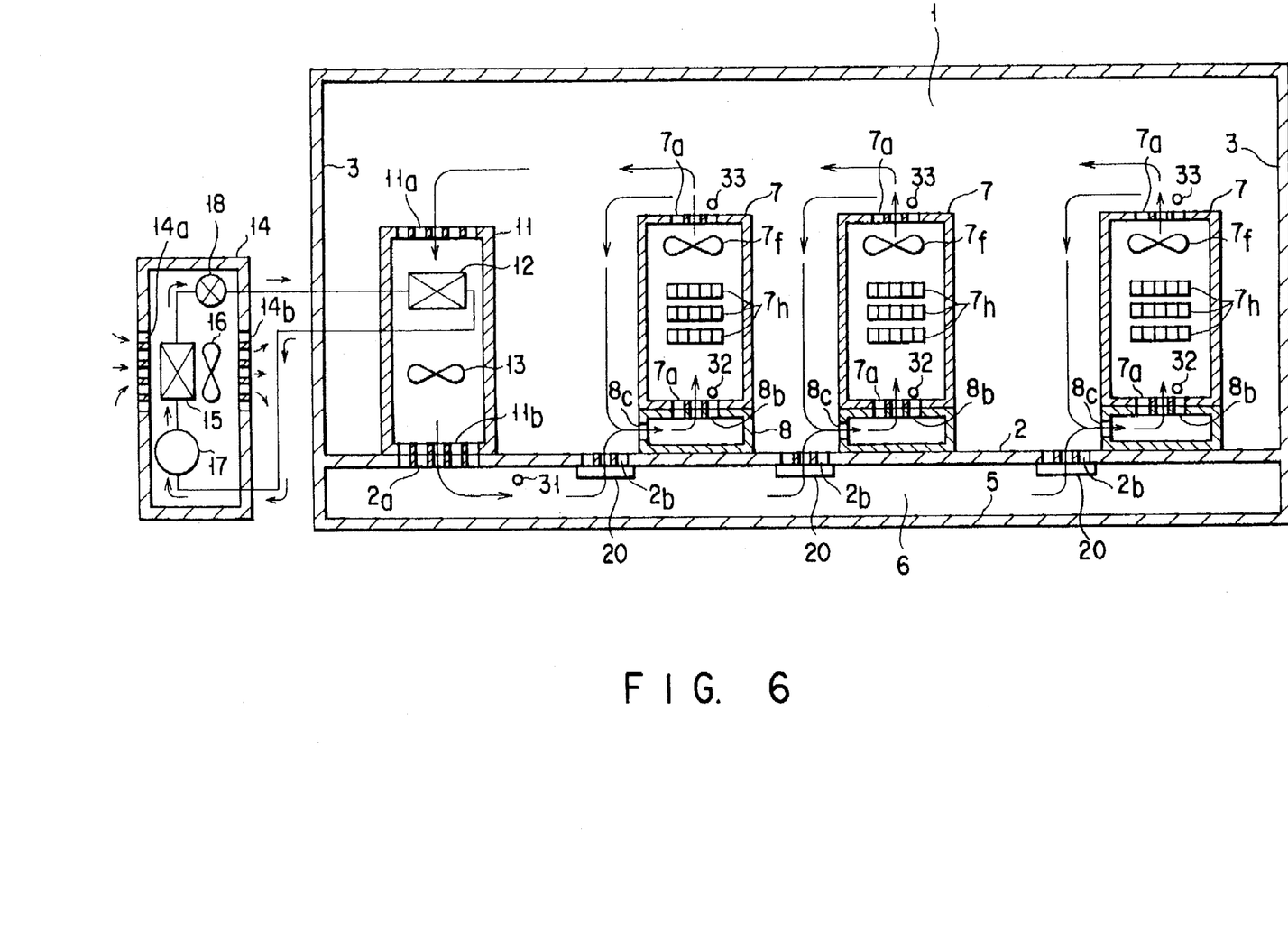
FIG. 6 schematically shows the construction of an air conditioning system used in a method according to a fourth embodiment of the present invention.

FIG. 6 shows an air conditioning system used in a method according to a fourth embodiment of the present invention. The system shown in FIG. 6 is substantially equal to that shown in FIG. 1, except that the support member 8 is not provided with an opening 8a formed in the bottom plate in the embodiment of FIG. 1, and that the opening 2b formed through the floor 2 right under the equipment 7 in FIG. 1 is moved immediately sideward of the support member 8. Of course, the air volume control unit 20 is also moved to be arranged for the moved opening 2b.

In the embodiment of FIG. 6, the cooling air introduced into the free space 6 of the double floor structure flows through the air volume control unit 20 and the opening 2b into the room space 1. Further, the cooling air within the room space 1 flows through the opening 8c into the support member 8 and, then, into the casing of the equipment 7 through the opening 8b and the air inlet 7a. The cooling air introduced into the casing absorbs the heat generated from the heat generating member 7h arranged within the casing and, then, is released into the room space 1. The air stream released into the room space 1 partly joins the air stream flowing through the opening 2b toward the opening 8c of the support member 8. Further, the combined air stream flows through the opening 8b and the air inlet 7a into the casing of the equipment 7. In this fashion, the air stream released into the room space 1 is partly recycled into the casing of the equipment 7 so as to produce the prominent effects as already described in conjunction with the system shown in FIG. 1.

In each of the embodiments described above, the support member 8 supporting the equipment 7 is disposed in direct contact with the floor 2. However, it is possible to eliminate the support member 8 such that the equipment 7 is disposed in direct contact with the floor 2.

Additional advantages and modifications will readily occur to those skilled in the art. Therefore, the invention in its broader aspects is not limited to the specific details, and illustrated examples shown and described herein. Accordingly, various modifications may be made without departing from the spirit or scope of the general inventive concept as defined by the appended claims and their equivalents.

What is claimed is:

1. An air conditioning method, comprising the steps of:

supplying a cooling air generated from an air conditioner into an air passageway formed below a floor;

guiding said cooling air within said air passageway into an equipment disposed on the floor through an opening made in the floor;

releasing the cooling air introduced into said equipment into the free space within a room; and introducing the air within the room into the equipment;

wherein the air released from within said equipment into the free space within the room is partly guided again directly into the equipment;

wherein said cooling air is prepared by sucking the air within said room into said air conditioner;

wherein the cooling air within the cooling passageway is guided into a plurality of equipments disposed on the floor; and wherein the flow rate of the cooling air introduced into each equipment through the floor is controlled in accordance with the temperature of the cooling air supplied from the air conditioner into the space below the floor, the difference in temperature between the air released from each equipment into the free space within the room and the cooling air introduced into each equipment through the floor, and the temperature, which is set in advance, within the free space of the room.

2. The method according to claim 1, wherein:

said equipment is supported by a support member disposed in direct contact with said floor;

said cooling air within said air passageway is guided into said equipment through said floor and said support member; and the air within said room is guided into the equipment through the support member.

3. The method according to claim 1, wherein fans for sucking said cooling air and part of the air released from each equipment into the free space within the room are arranged within each equipment disposed on the floor, and the air blowing volume of said fan is larger than the air volume sucked through the floor into the equipment.

* * * * *

UNITED STATES PATENT AND TRADEMARK OFFICE
CERTIFICATE OF CORRECTION

PATENT NO. : 5,718,628
DATED : February 17, 1998
INVENTOR(S) : Hideaki Nakazato, Hirofumi Hayama, Manabu Kishita, Masaki Nakao It is certified that error appears in the above-identified patent and that said Letters Patent is hereby corrected as shown below:

Title page, item [30], change the name of Assignee from "NIT Power and Building Facilities, Inc.; Nippon Telegraph and Telephone Corporation" to --NTT Power and Building Facilities, Inc.; Nippon Telegraph and Telephone Corporation"--

Signed and Sealed this

Fifteenth Day of September, 1998

*Attest:*

BRUCE LEHMAN

*Attesting Officer*   *Commissioner of Patents and Trademarks*